(12) United States Patent
Boukhayma et al.

(10) Patent No.: US 9,263,494 B2
(45) Date of Patent: Feb. 16, 2016

(54) CMOS IMAGE SENSOR

(71) Applicant: Commissariat a l'energie atomique et aux energies alternatives, Paris (FR)

(72) Inventors: Assim Boukhayma, Grenoble (FR); Arnaud Peizerat, Grenoble (FR)

(73) Assignee: Commissariat a l'energie atomique et aux energies alternatives (FR)

( * ) Notice: Subject to any disclaimer, the term of this patent is extended or adjusted under 35 U.S.C. 154(b) by 0 days.

(21) Appl. No.: 14/731,072

(22) Filed: Jun. 4, 2015

(65) Prior Publication Data

US 2016/0013238 A1 Jan. 14, 2016

(30) Foreign Application Priority Data

Jul. 9, 2014 (FR) ...................................... 14 56596

(51) Int. Cl.
*H01L 27/146* (2006.01)
*H04N 5/357* (2011.01)

(52) U.S. Cl.
CPC .... *H01L 27/14643* (2013.01); *H01L 27/14612* (2013.01); *H04N 5/357* (2013.01)

(58) Field of Classification Search
CPC ...... H04N 5/357; H04N 5/369; H01L 27/146; H01L 27/14609; H01L 27/14612; H01L 27/14643
See application file for complete search history.

(56) References Cited

U.S. PATENT DOCUMENTS

| 2006/0202242 A1 | 9/2006 | Takagi et al. |
| 2009/0290058 A1 | 11/2009 | Miyagawa |
| 2011/0267505 A1 | 11/2011 | Dierickx |

OTHER PUBLICATIONS

Boukhayma, et al., "Comparison of two optimized readout chains for low light CIS," "Image Sensors and Imaging Systems 2014," Mar. 4, 2014, pp. 1-11, vol. 9022, No. 90220H, Publisher: SPIE Proceedings.
"French Search Report," dated Mar. 25, 2015, issued in counterpart French Patent Application No. FR 14/56596.

*Primary Examiner* — Whitney T Moore
(74) *Attorney, Agent, or Firm* — Kaplan Breyer Schwarz & Ottesen, LLP

(57) ABSTRACT

A CMOS image sensor including a pixel including: a photodiode in series with a MOS transistor between a first reference potential and a sense node; a MOS transistor connecting the sense node to a second reference potential; and a third MOS transistor assembled as a source follower between the sense node and a read circuit, wherein the oxide thickness of the third transistor is smaller than that of the first and second transistors, the voltage difference between the first and second reference potentials is greater than the maximum voltage capable of being applied between two terminals of the third transistor, and the body or drain region of the third transistor is connected to a third reference potential in the range between the first and second potentials.

10 Claims, 1 Drawing Sheet

CMOS IMAGE SENSOR

The present patent application claims the priority benefit of French patent application FR14/56596, filed Jul. 9, 2014, the contents of which are incorporated herein by reference in its entirety to the maximum extent allowable by law.

BACKGROUND

The present disclosure relates to the field of CMOS image sensors. It particularly aims at a low-noise CMOS image sensor, capable of operating in low brightness conditions.

DISCUSSION OF THE RELATED ART

Conventionally, a CMOS image sensor comprises pixels arranged in an array of rows and columns. Each pixel comprises a photodiode used in reverse mode, having its junction capacitance discharged by a photocurrent according to a received light intensity. At the end of a period, called image acquisition or integration period, before and after which the pixel is reset by recharging of its photodiode, the photogenerated charges stored in the photodiode are transferred to a capacitive sense node of the pixel. The illumination level received by the pixel is measured by measuring the potential variation of the pixel sense node, caused by the transfer, on this node, of the charges photogenerated in the photodiode of the pixel.

In practice, various noise sources are capable of affecting the measurement, which may raise an issue when the quantity of charges photogenerated in the photodiode is small, particularly when the sensor is used in low brightness conditions.

There is a need for a CMOS image sensor overcoming all or part of the disadvantages of existing sensors. More particularly, there is a need for a low-noise CMOS image sensor, capable of operating in low brightness conditions.

SUMMARY

Thus, an embodiment provides a CMOS image sensor comprising at least one pixel comprising: a photodiode having a first terminal connected to a first reference potential; a first MOS transistor connecting a second terminal of the photodiode to a sense node of the pixel; a second MOS transistor connecting the sense node to a second reference potential; and a third MOS transistor assembled as a follower source having its gate connected to the sense node and having its source intended to be connected to a read circuit, wherein the third transistor has a gate oxide thickness smaller than the gate oxide thickness of the first and second transistors, the potential difference between the first and second reference potentials is greater than the maximum voltage capable of being applied between two terminals of the third MOS transistor, and the body region or the drain region of the third transistor is connected to a third reference potential in the range between the first and second potentials.

According to an embodiment, the body region of the third transistor is insulated from the body region of the first transistor and the potential applied to the body region of the third transistor is different from that applied to the body region of the first transistor.

According to an embodiment, the third transistor is a P-channel transistor.

According to an embodiment, the first and second transistors are N-channel transistors, the body regions of the first and second transistors are connected to the first reference potential, the body region of the third transistor is connected to the second reference potential, and the drain region of the third transistor is connected to the third reference potential.

According to an embodiment, the pixel further comprises a fourth MOS transistor connecting the source of the third transistor to an output track of the pixel.

According to an embodiment, the fourth transistor has a gate oxide thickness greater than the gate oxide thickness of the third transistor.

According to an embodiment, the fourth transistor is a transistor of the same type as the third transistor.

According to an embodiment, the photodiode is a pinned diode comprising an N-type doped storage region, formed in a P-type doped substrate, and a P-type doped layer coating the storage region, this layer having a higher doping level than the substrate.

According to an embodiment, the first, second, and third transistors are N-channel transistors, the body regions of the first and second transistors are connected to the first reference potential, the body region of the third transistor is connected to the third reference potential, and the drain region of the third transistor is connected to a fourth reference potential.

According to an embodiment, the third transistor has a gate surface area smaller than that of the first and second transistors.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the various drawings and, further, as usual in the representation of integrated circuits, the various drawings are not to scale.

DETAILED DESCRIPTION

Figure 1:
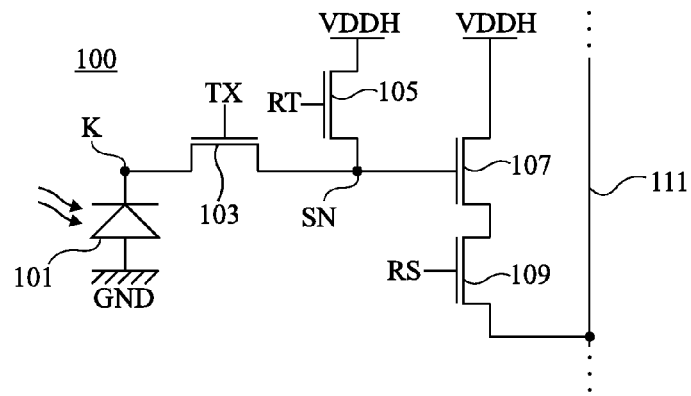
FIG. 1 is an electric diagram of an example of a pixel of a CMOS image sensor.

FIG. 1 is an electric diagram showing an example of a pixel 100 of a CMOS image sensor. Pixel 100 comprises a photodiode 101, a storage node K formed by the cathode of photodiode 101, and a sense node SN. The anode of photodiode 101 is connected to a node of application of a low reference potential GND, for example, the ground. Pixel 100 further comprises a transfer transistor 103 having its conduction nodes (source/drain) respectively connected to node K and to node SN, a reset transistor 105 having its conduction nodes respectively connected to node SN and to a node of application of a high reference potential VDDH, a read transistor 107 assembled as a source follower, having its gate connected to node SN and having its drain connected to a node of application of a reference potential, and a selection transistor 109 having its conduction nodes respectively connected to the source of read transistor 107 and to an output conductive track 111, generally called column, which may be common to a plurality of sensor pixels.

In the shown example, transistors 103, 105, 107, and 109 are N-channel MOS transistors, and transistor 107, assembled as a source follower (or common drain assembly), has its drain connected to a node of application of a high reference potential, potential VDDH in this example.

In operation, the potential variations of node SN are transferred to the source of transistor 107 in a substantially identical form, that is, with no amplification or with a gain in the order of 1. Pixel 100 receives control signals TX, RT, and RS respectively applied to the gates of transistors 103, 105, and 109.

As an example, pixel 100 may be controlled as follows:

During a pixel integration phase (preceded by a step of resetting photodiode 101), transfer transistor 103 may be kept non-conductive (signal TX in the low state in the present example) to isolate storage node K from sense node SN. The electric charges generated in photodiode 101 under the effect of light then cause a progressive decrease of the voltage of node K.

Before the end of the integration phase, reset transistor 105 may be turned on (signal RST in a high state in this example) to reset the potential of sense node SN to potential VDDH, after which transistor 105 may be turned off to isolate node SN from node VDDH.

After the step of resetting node SN, the potential of node SN may be read and stored in a first read step, to be used as a reference for a subsequent step of measuring the discharge level of the photodiode. To achieve this, selection transistor 109 is turned on (signal RS in a high state in this example), so that the potential of node SN is transferred to output track 111, via transistors 107 and 109. The potential of track 111 may then be read and stored, via a read circuit, not shown.

After the first reading step, transfer transistor 103 may be turned on (signal TX in the high state in this example) to cause the transfer of the photogenerated charges stored in the photodiode onto sense node SN. The voltage at node SN then decreases by a value representative of the amount of photogenerated charges stored in the photodiode, and thus of the light intensity received by the photodiode during the integration.

The potential of node SN, transferred onto output track 111 by transistors 107 and 109, can then be read again during a second read step, by a read circuit, not shown.

The output value of the pixel is for example equal to the difference between reference potential $V_{OUT1}$ read from track 111 during the first reading step and potential $V_{OUT2}$ read from track 111 during the second reading step.

An advantage of such a reading method, generally called CDS in the art, for "Correlated Double Sampling", is that it enables to at least partly do away with certain sources of noise, such as the reset noise introduced by transistor 105.

Other reading methods may be used to decrease the noise, for example, a reading of the type generally called CMS in the art, for "Correlated Multiple Sampling", comprising integrating a plurality of successive samples of the output value of the pixel, which enables to increase the signal-to-noise ratio.

Figure 2:
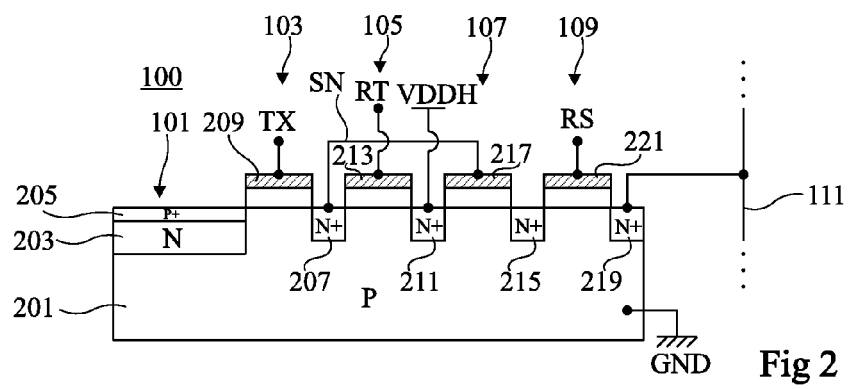
FIG. 2 is a simplified cross-section view of the pixel of FIG. 1.

FIG. 2 is a simplified cross-section view illustrating an embodiment of pixel 100 of FIG. 1. In this example, pixel 100 is formed inside and on top of a portion of a P-type doped semiconductor substrate 201 (for example, made of silicon).

Photodiode 101 is formed close to the surface of substrate 201, and comprises an N-type doped region 203, topped with a P-type doped region 205 of higher doping level than substrate 201. Region 203 defines a photogenerated charge storage area. In this example, photodiode 101 is a so-called pinned photodiode, or buried photodiode. In the absence of photogenerated charges, the potential of storage region 203 is defined by the doping levels of regions 201, 203, and 205, and is for example equal to 1.5 V. The use of a pinned diode enables to significantly decrease the pixel noise, and more particularly the noise due to dark currents and the reset noise.

Transistor 103 comprises an N-type doped region 207, for example having a higher doping level than region 203, separated from photodiode 101 by a region of substrate 201, and an insulated gate 209 coating the surface of substrate 201 between photodiode 101 and region 207. Region 207 defines the drain of transistor 103, and region 203 defines the source of transistor 103. The portion of substrate 201 located under gate 209, between regions 203 and 207, defines a body region (also called "well"), or channel-forming region, of transistor 103.

Transistor 105 comprises an N-type doped region 211, for example having the same doping level as region 207, separated from region 207 by a portion of substrate 201, and an insulated gate 213 coating the surface of substrate 201 between region 207 and region 211. Region 207 defines the source of transistor 105, and region 211 defines the drain of transistor 105. The portion of substrate 201 located under gate 213, between regions 207 and 211, defines the body region, or channel-forming region, of transistor 105.

Transistor 107 comprises an N-type doped region 215, for example having the same doping level as region 207, separated from region 211 by a portion of substrate 201, and an insulated gate 217 coating the surface of substrate 201 between region 211 and region 215. Region 215 defines the source of transistor 107, and region 211 defines the drain of transistor 107. The portion of substrate 201 located under gate 217, between regions 211 and 215, defines the body region, or channel-forming region, of transistor 107.

Transistor 109 comprises an N-type doped region 219, for example having the same doping level as region 207, separated from region 215 by a portion of substrate 201, and an insulated gate 221 coating the surface of substrate 201 between region 215 and region 219. Region 219 defines the source of transistor 109, and region 215 defines the drain of transistor 109. The portion of substrate 201 located under gate 221, between regions 215 and 219, defines the body region, or channel-forming region, of transistor 109.

In this example, gate 209 of transistor 103 is connected to a node of application of signal TX, gate 213 of transistor 105 is connected to a node of application of signal RT, gate 217 of transistor 107 is connected to node SN, gate 221 of transistor 109 is connected to a node of application of signal RS, region 207 is connected to node SN, region 211 is connected to a node of application of high reference potential VDDH, substrate 201 (and accordingly, the anode of diode 103 as well as the body regions of transistors 103, 105, 107, and 109) is connected to a node of application of low reference potential GND, and region 219 is connected to output track 111.

A node source which raises a particular issue in applications with a low illumination level is the read noise generated by the read transistor assembled as a source follower, and more particularly the 1/f component of the read noise, also called flicker noise. Such a noise source indeed remains significant even when a reading of CDS or CMS type is implemented, and may become preponderating in low brightness conditions.

Based on analytic calculations detailed in an article entitled "Comparison of two optimized readout chains for low light CIS", of Assim Boukhayma et al. (SPIE Proceedings Vol. 9022), the content of which is incorporated herein by reference, it has been shown that variance $\overline{Q^2}$ (in [Coulomb$^2$]) of the 1/f read noise relative to the input, introduced by the read transistor assembled as a source follower, can be expressed as:

$$\overline{Q^2} = \alpha_{CMS} \frac{K}{C_{ox}^2 WL}(C_{SN} + c_{GS}WL + c_{GD}W)^2,$$

K being a parameter proportional to kT depending on the considered technology (where k is Boltzman's constant and T is the absolute temperature), $\alpha_{CMS}$ being a noise reduction factor independent from the pixel structure and only depending on the product of the circuit bandwidth by the time between the read samples, as well as on the number of stored samples (in the case of a CMS-type reading), $C_{ox}$ being the gate-substrate surface capacitance formed by the gate oxide of the read transistor assembled as a source follower, W and L respectively being the gate width and length of the read transistor, $C_{SN}$ being the capacitance of sense node SN, particularly depending on the stray capacitances of the reset transistor and of the transfer transistor, and $c_{GS}$ and $c_{GD}$ respectively being the gate-source surface capacitance and the gate-drain linear capacitance of the read transistor.

Generally, in a given CMOS integrated circuit chip manufacturing process, two different gate oxide thicknesses are available to form MOS transistors. Conventionally, in an image sensor comprising pixels with four MOS transistors of the type described in relation with FIGS. 1 and 2, the four transistors of the pixel (transistors 103, 105, 107, and 109) are thick-oxide transistors. Thick-oxide transistors may indeed operate at nominal voltages greater than the nominal operating voltages of thin-oxide transistors, and thus enable to form pixels having a larger dynamic range (or measurement range). The use of thick oxide transistors is particularly adapted when the photodiode is a pinned photodiode of the type described in relation with FIG. 2. This type of photodiode indeed has an open-circuit voltage (in the absence of photogenerated charges) which may be relatively high, for example, close to the nominal operating voltage of thin oxide MOS transistors. The use of thin-oxide transistors would then not enable to obtain a sufficient dynamic operating range for the pixel.

According to an aspect of an embodiment, a pixel comprising a photodiode, a sense node, a transfer transistor, a reset transistor, and a read transistor assembled as a follower source is provided, where the transfer transistor and the reset transistor are thick oxide transistors, and where the read transistor is a thin-oxide transistor. The use of a thin-oxide read transistor enables to increase the gate-substrate surface capacitance formed by the gate oxide of the read transistor with respect to a pixel where the read sensor is a thick-oxide transistor. Tests carried out by the inventors have shown that in such a pixel, the read noise, and more particularly the 1/f noise, is significantly decreased with respect to a pixel where the read transistor is a thick-oxide transistor. Preferably, the read transistor further has a gate surface area (WL) smaller than the gate surface area of the transfer and reset transistors and, more generally, lower than the minimum gate surface area of thick-oxide transistors in the considered technology. This enables to further decrease the 1/f component of the read noise.

To avoid losing dynamics with respect to a pixel where all transistors are thick-oxide transistors, the body region of the read transistor is insulated from the body regions of the transfer and reset transistors. The body and drain regions of the read transistor are biased so that the read transistor can receive on its gate the entire potential swing of sense node SN (from the reset potential to the saturation potential of the pixel), without for the gate-drain or gate-body voltage of the read transistor to exceed nominal operating voltage VDDL of a thin-oxide MOS transistor. The body and drain regions of the read transistor are for example biased so that the body-drain voltage of the read transistor is equal to nominal operating voltage VDDL of thin oxide MOS transistors. The transfer and reset transistors remain biased to a voltage preferably equal to nominal operating voltage VDDH of thick-oxide MOS transistors to maximize the range of possible measurement values.

Figure 3:
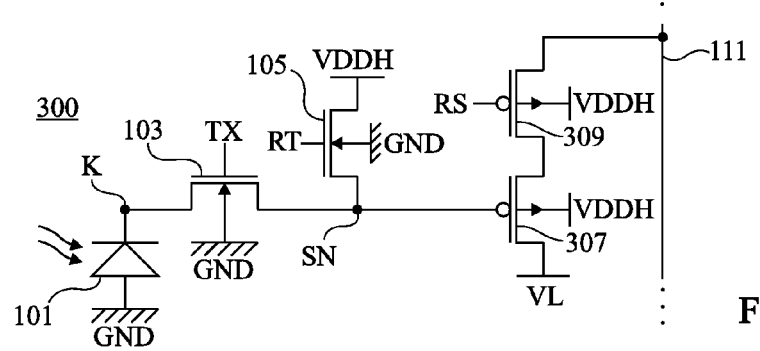
FIG. 3 is an electric diagram of an embodiment of a CMOS image sensor pixel.

FIG. 3 is an electric diagram of an embodiment of a pixel 300 of a CMOS image sensor. Pixel 300 comprises, like pixel 100 of the example of FIG. 1, a photodiode 101, a storage node K formed by the cathode of photodiode 101, and a sense node SN. The anode of photodiode 101 is connected to a node of application of a low reference potential GND, for example, the ground. Pixel 300 further comprises, as in the example of FIG. 1, a transfer transistor 103 connecting node K to node SN, and a reset transistor 105 connecting node SN to a node of application of a high reference potential VDDH. Pixel 300 further comprises a read transistor 307 assembled as a source follower, having its gate connected to node SN and having its drain connected to a node of application of an intermediate reference voltage VL, and a selection transistor 309 having its conduction nodes respectively connected to the source of read transistor 307 and to an output conductive track 111, which may be common to a plurality of pixels of the sensor.

In the shown example, transistors 103 and 105 are N-channel MOS transistors, and transistors 307 and 309 are P-channel MOS transistors. In this example, transistors 103, 105, and 309 are thick-oxide transistors, and transistor 307 is a thin-oxide transistor. Transistors 103 and 105 have their body regions connected to a node of application of low reference potential GND, and transistors 307 and 309 have their body regions connected to a node of application of high reference potential VDDH. Read transistor 307 has its drain connected to a node of application of an intermediate reference potential VL, between low reference potential GND and high reference potential VDDH. As a variation, the body region of read transistor 307 may be connected to the source of this same transistor.

In operation, the potential variations of node SN are transferred to the source of transistor 307 in a substantially identical form. Pixel 300 receives control signals TX, RT, and RS respectively applied to the gates of transistors 103, 105, and 309.

As an example, pixel 300 may be controlled substantially in the same way as pixel 100 of FIG. 1, by adapting the level of the logic signals according to the conductivity type of the transistors.

Voltage VDDH (relative to ground GND) for example corresponds to the nominal power supply voltage of thick-oxide MOS transistors in the considered technology. Intermediate potential VL applied to the drain of transistor 307 may be selected so that, in normal conditions of use of the pixel, transistor 307 never sees a voltage higher than nominal operating voltage VDDL (relative to ground) of thin-oxide MOS transistors in the considered technology. As an example, voltage difference VDDH-VL corresponds to nominal power supply voltage VDDL of thin-oxide MOS transistors in the considered technology.

As a non limiting illustration, a technological process where thick-oxide MOS transistors are provided to operate at voltages which may range up to 3.3 V, and where thin-oxide MOS are provided to operate at voltages capable of ranging up to 1.8 V is considered. For example, low reference potential GND is equal to 0 V and high reference potential VDDH is equal to 3.3 V. Photodiode 101 is for example a pinned diode having, in the absence of photogenerated charges (after transfer of the photogenerated charges onto sense node SN), a cathode potential equal to 1.5 V. Intermediate reference potential VL applied to the drain of read transistor 307 is for example equal to 1.5 V.

It should be noted that in practice, the thick oxide is approximately twice as thick as the thin oxide, and nominal power supply voltage VDDH of thick-oxide MOS transistors is substantially lower than or equal to twice nominal power supply voltage VDDL of thin-oxide MOS transistors.

If open-circuit voltage Vpin of the photodiode is of the same order of magnitude as nominal power supply voltage VDDL of thin-oxide MOS transistors, then, the variation range of potential $V_{SN}$ (or voltage relative to ground) at the sense node has an amplitude substantially equal to VDDL. More specifically, potential $V_{SN}$ varies between a value Vpin and the maximum reset voltage of node SN, which is VDDH-Vtn, where Vtn is the threshold voltage of the reset NMOS transistor. If the variation amplitude at node SN, equal to VDDH-Vtn-Vpin, is lower than voltage VDDL, it is then possible to find a reference potential VL of the read transistor which enables to respect the maximum voltage capable of being applied across the read transistor. It should be noted that the present invention is particularly advantageous in the case where transistors 103, 105 with a thick oxide are submitted to particularly high voltages (equal or close to nominal voltage VDDH) higher than nominal voltage VDDL capable of being reasonably withstood by a thin-oxide transistor. In this case, the use of a dedicated biasing for the body region of the read transistor or the use of an adapted bias voltage for the drain of the read transistor makes the use of a thin-oxide transistor possible for the read transistor. In other words, the use of an intermediate reference potential VL different from low and high reference potentials GND and VDDH enables in this case to provide a good operation of the thin-oxide transistor.

Further, selection transistor 109 preferably is a thick-oxide MOS transistor. Indeed, the use of a thin-oxide MOS transistor would require controlling its gate with a control voltage having a controlled swing to avoid damaging the transistor. In the case of the example described hereabove in relation with FIG. 3, the control voltage of the gate of selection transistor 109, made of simple oxide, may for example oscillate between a low level equal to reference potential VL and high reference potential VDDH. Since the gate voltage of selection transistor 109, of PMOS type in the present example, necessarily is at a sufficiently high voltage (VL) higher than GND (as is the case with a thick-oxide transistor), the on-state resistance of the selection transistor is higher than in the case of a thick-oxide transistor. This accordingly results in slowing down the reading of the pixel, or in degrading the transmitted voltage value (if the pixel reading time does not allow a full charge of output conductive track 111 (column). Further, the circuit complexity is increased in the case where the control levels of the gate of the selection transistor should switch between potential levels which do not correspond to ground or to a power supply voltage (VDDH, VDDL).

Further, it is preferable for selection transistor 309 to be of the same type as read transistor 307, so that the potential level present on the source of the read transistor is properly transmitted to output conductive track 111 (column).

Figure 4:
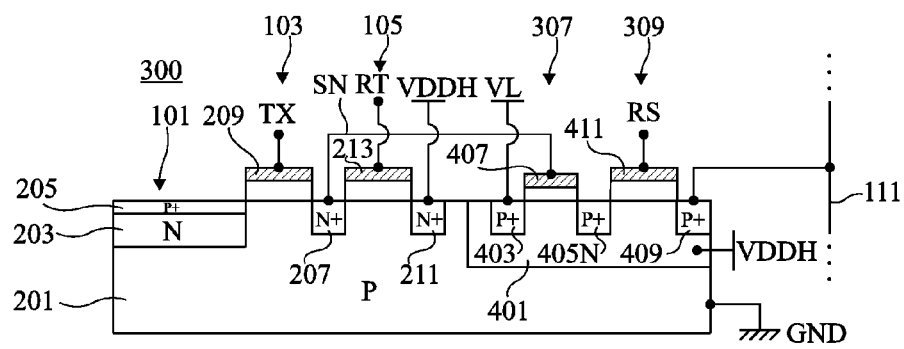
FIG. 4 is a simplified cross-section view illustrating an embodiment of the pixel of FIG. 3.

FIG. 4 is a simplified cross-section view illustrating an embodiment of pixel 300 of FIG. 3. In this example, pixel 300 is formed inside and on top of a portion of a P-type doped semiconductor substrate 201 (for example, made of silicon). Photodiode 101, transistor 103, and transistor 105 are substantially identical to what has been described in relation with FIG. 2, and transistors 307 and 309 are formed in a same N-type doped well 401, formed in an upper portion of substrate 201.

Transistor 307 comprises two P-type doped regions 403 and 405, formed in an upper portion of well 401 and separated by a portion of well 401. Transistor 307 further comprises an insulated gate 407 coating the surface of well 401 between region 403 and region 405. Region 403 defines the drain region of transistor 307, and region 405 defines the source region of transistor 307. The portion of well 401 located under gate 407, between regions 403 and 405, defines the body region, or channel-forming region, of transistor 307.

Transistor 309 comprises a P-type doped region 409, for example, of same doping level as regions 403 and 405, separated from region 405 by a portion of well 401, and an insulated gate 411 coating the surface of well 401 between region 405 and region 409. Region 405 defines the drain region of transistor 309 and region 409 defines the source region of transistor 309. The portion of well 401 located under gate 411, between regions 405 and 409, defines the body region, or channel-forming region, of transistor 309.

In this example, gate 209 of transistor 103 is connected to a node of application of signal TX, gate 213 of transistor 105 is connected to a node of application of signal RT, gate 407 of transistor 307 is connected to node SN, gate 411 of transistor 309 is connected to a node of application of signal RS, region 207 is connected to node SN, region 211 is connected to a node of application of high reference potential VDDH, substrate 201 (and accordingly the anode of diode 103 as well as the body regions of transistors 103 and 105) is connected to a node of application of low reference potential GND, well 401 (and accordingly, the body regions of transistors 307 and 309) is connected to a node of application of high reference potential VDDH, region 403 is connected to a node of application of intermediate reference potential VL, and region 409 is connected to output track 111.

An advantage of the embodiments described in relation with FIGS. 3 and 4 is that they enable, due to the surface capacitance increase and, possibly, to the gate surface area decrease, of the read transistor, to significantly decrease the pixel read nose as compared with a pixel of the type described in relation with FIGS. 1 and 2. As an illustration, with a CMS-type reading with 4 stored samples per read operation, the inventors have measured a 1/f noise level relative to sense node SN of 1.25 e⁻ for the pixel of FIGS. 1 and 2, and of 0.2 e⁻ only for the pixel of FIGS. 3 and 4.

Advantageously, in the case of an image sensor with a plurality of pixels, neighboring pixels may share a same well 401 where transistors 307 and 309 are formed, which enables to decrease the sensor bulk.

Specific embodiments have been described. Various alterations, modifications, and improvements will readily occur to those skilled in the art.

In particular, it will be within the abilities of those skilled in the art to adapt the described embodiments to the case where the read transistor assembled as a source follower is an N-type MOS transistor. In this case, the body region of the read transistor is insulated from the body region of the transfer and reset transistors by means of a triple-well structure, to be able to insulate the body region of the read transistor from substrate 201, to be able to bias them to different voltages. The body region of the read transistor is then connected to a node of application of an intermediate reference potential Vreflow which is preferably smaller than or equal to the minimum voltage capable of being present on the transistor source, that is, Vpin–Vt1 (where Vt1 is the threshold voltage of the thin-oxide read transistor), for example, 1.5 V–0.5 V=1 V. The drain region of the read transistor is then connected to a node of application of a high reference potential VrefHigh, for example equal to VrefLow+VDDL (VrefHigh is for example equal to à 1 V+1.8 V=2.8 V). Reference potentials VrefLow and VrefHigh are thus preferably selected so that the read transistor never sees across its terminals a voltage greater than the nominal operating voltage of thin-oxide transistors in the considered technology.

Such an embodiment with an NMOS-type read transistor requires using a triple-well structure which is bulky and decreases the pixel density. Further, in practice, two voltage references VrefLow and Vrefhigh, different from the power supply voltages and from ground, may appear to be necessary to respect the voltage constraints of the thin-oxide transistor. For this last point, it may be envisaged to bias the drain of reset transistor 105 to the same voltage Vrefhigh as that applied to the drain of the NMOS selection transistor since the maximum level capable of flowing through the NMOS transistor is equal to VDDH−Vtn2 (Vtn2 being the threshold voltage of the thick-oxide reset NMOS transistor), that is, for example, 3.3 V−0.5 V=2.8 V.

Further, the inventors have observed that, in practice, the use of an NMOS transistor as a read transistor does not provide the same good results for 1/f noise as with a PMOS transistor.

Thus, in the case of a photodiode of pinned type associated with an NMOS transfer transistor, the preferred embodiment is that described in relation with FIG. 3 with thick-oxide NMOS-type transfer and reset transistors, a thin-oxide PMOS-type read transistor, and a thick-oxide PMOS-type selection transistor.

Although the use of pinned photodiodes of a type opposite to that shown in FIG. 3 is relatively uncommon, there could be an N+/P/N photodiode, on an N-type substrate, associated with a PMOS-type transfer transistor. In this case, it could be envisaged to only have PMOS-type transistors, the transfer and reset transistors having a thick oxide and the read transistor having a thin oxide, the selection transistor preferably having a thick oxide. Further, in the case of such a N+/P/N photodiode, the cathode would be connected to high reference potential VDDH and the anode would be connected to the transfer transistor.

Further, although the above-mentioned examples show transfer and reset transistors of the same type, those could be different. However, for reasons of density and also to limit the surface areas of wells capable of creating parasitic diodes, the use of a same type of transistors will be preferred.

Further, the described embodiments are not limited to the numerical examples of bias potentials mentioned hereabove.

Further, the described embodiments are not limited to the specific case described hereabove, where the photodiode is a pinned diode.

Further, the number of transistors present in the pixel is not limited to 3 or 4 as appears in the described examples, the selection transistor being needless in certain cases. It will be within the abilities of those skilled in the art to add other transistors to carry out other functions than those described hereabove. A general reset transistor, directly connected to the photodiode, to carry out functions known as global shutter functions, may in particular be added.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A CMOS image sensor comprising at least one pixel (300) comprising:

a photodiode (101) having a first terminal connected to a first reference potential (GND);
 a first MOS transistor (103) connecting a second terminal of the photodiode (101) to a sense node (SN) of the pixel;
 a second MOS transistor (105) connecting the sense node (SN) to a second reference potential (VDDH); and
 a third MOS transistor (307) assembled as a source follower having its gate (407) connected to the sense node (SN) and having its source intended to be connected to a read circuit;
 wherein the third transistor (307) has a gate oxide thickness smaller than the gate oxide thickness of the first (103) and second (105) transistors, the potential difference between the first (GND) and second (VDDH) reference potentials is greater than the maximum voltage capable of being applied between two terminals of the third MOS transistor (307), and the body region or the drain region of the third transistor (307) is connected to a third reference potential (VL) in the range between the first (VDDH) and second (GND) potentials.

2. The sensor of claim 1, wherein the body region of the third transistor (307) is insulated from the body region of the first transistor (103) and the potential (VL) applied to the body region of the third transistor (307) is different from that applied to the body region of the first transistor (103).

3. The sensor of claim 1, wherein the third transistor (307) is a P-channel transistor.

4. The sensor of claim 3, wherein the first (103) and second (105) transistors are N-channel transistors, the body regions of the first (103) and second (105) transistors are connected to the first reference potential (GND), the body region of the third transistor (307) is connected to the second reference potential (VDDH), and the drain region of the third transistor (307) is connected to the third reference potential (VL).

5. The sensor of claim 1, wherein said at least one pixel (300) further comprises a fourth MOS transistor (309) connecting the source of the third transistor (307) to an output track (111) of the pixel.

6. The sensor of claim 5, wherein the fourth transistor (309) has a gate oxide thickness greater than the gate oxide thickness of the third transistor (309).

7. The sensor of claim 5, wherein the fourth transistor (309) is a transistor of same type as the third transistor (307).

8. The sensor of claim 1, wherein the photodiode (101) is a pinned diode comprising an N-type doped storage region (203), formed in a P-type doped substrate (201), and a P-type doped layer (205) coating the storage region (203), said layer (205) having a higher doping level than the substrate (201).

9. The sensor of claim 2, wherein the first (103), second (105), and third transistors are N-channel transistors, the body regions of the first (103) and second (105) transistors are connected to the first reference potential (GND), the body region of the third transistor (307) is connected to the third reference potential (Vreflow), and the drain region of the third transistor (307) is connected to a fourth reference potential (Vrefhigh).

10. The sensor of claim 1, wherein the third transistor (307) has a gate surface area smaller than that of the first (103) and second (105) transistors.

* * * * *